United States Patent [19]

Larson

[11] Patent Number: 5,687,062

[45] Date of Patent: Nov. 11, 1997

[54] HIGH-THERMAL CONDUCTIVITY CIRCUIT BOARD

[75] Inventor: Ralph I. Larson, Bolton, Mass.

[73] Assignee: Heat Technology, Inc., South Lancaster, Mass.

[21] Appl. No.: 603,210

[22] Filed: Feb. 20, 1996

[51] Int. Cl.$^6$ ................................................. H05K 7/20
[52] U.S. Cl. .................... 361/706; 174/252; 174/257; 361/720; 428/901
[58] Field of Search .................................. 174/52.4, 252, 174/256–260; 361/706–708, 712, 713, 719–720; 428/901

[56] References Cited

U.S. PATENT DOCUMENTS

| | | |
|---|---|---|
| 3,165,672 | 1/1965 | Gellert ................................. 361/706 |
| 4,056,681 | 11/1977 | Cook, Jr. ............................... 174/52.4 |
| 4,633,035 | 12/1986 | McMonagle ........................... 428/901 |
| 4,675,784 | 6/1987 | Dahlberg et al. ...................... 361/706 |

*Primary Examiner*—Gregory D. Thompson
*Attorney, Agent, or Firm*—Christopher S. Daly

[57] ABSTRACT

A thermally efficient circuit board has a base layer with high thermal conductivity and a thermal expansion coefficient close to that of silicon, such as aluminum silicon carbide. Above the base layer is a layer of anodized metal, either a separate material, such as aluminum, which is formed on the base and then anodized, or an anodized portion of the base itself. To the anodized metal is then applied a sealant material of lower thermal conductivity, but good electrically insulative and adhesive qualities, such as Teflon FEP. The sealant flows into cavities in the porous anodized metal structure, creating a well-anchored bond. A metal foil layer is then bonded to the surface of the sealant, and used to pattern conductive circuit paths using conventional methods.

22 Claims, 4 Drawing Sheets

HIGH-THERMAL CONDUCTIVITY CIRCUIT BOARD

BACKGROUND OF THE INVENTION

1. Field of the Invention

This invention relates to thermal control of board-mounted electronic devices and, more specifically, to an improved circuit board construction with high thermal efficiency.

2. Description of the Related Art

Electronic devices are typically mounted and electrically connected to a board, commonly referred to as a circuit board. The circuit board is usually comprised of electrical interconnects which are, in turn, connected to the electronic devices mounted thereto. The circuit board can either be an all-in-one electronic device, or can be plugged into an electrical connector which connects it to other external electronic devices.

The electronic devices mounted to a circuit board can be any of a number of conventional or hybrid devices such as resistors, capacitors, pin-mounted integrated circuit (IC) packages, surface-mounted IC packages, and the like. When operated, such devices dissipate energy in the form of heat. If the device is unable to transfer enough of its heat to the surrounding air, the elevated operating temperature of the device can result in its premature failure.

Generally speaking, heat can be transferred from the electronic device to a coolant, (e.g. air) either directly or indirectly. The direct method is accomplished by circulating the air over the electronic device. Heat is absorbed from the device by the air, which is then exhausted to the ambient environment. For low-power devices, the surface area of the electronic device itself is sufficient to allow removal of the desired amount of heat with a sufficiently-low rise in device temperature. Higher power devices, however, often require the use of a heat sink attached to, and in thermal contact with, the electronic device. The heat sink is a high thermal conductivity material with a large surface area which spreads heat from the device over a greater surface area, improving the efficiency of the transfer of heat to the circulating air. If designed correctly, a heat sink can keep the temperature of the electronic device lower than that of a similar device without a heat sink. However, the expense of manufacturing a heat sink and attaching it to a device can significantly increase the overall cost of the device.

The indirect method of removing heat from an electronic device involves transferring heat from the device to the circuit board. Since the circuit board is already attached to the electronic device to be cooled, it can act much like a heat sink itself. Heat is conducted (typically downward) from the device to the circuit board. Solder bumps and thermal shims or posts can be also be used to create high thermal conductivity paths deeper into the board, since the circuit board itself is typically not a good thermal conductor.

To improve the conduction of heat from the device to the air, the circuit board must conduct heat laterally away from the electronic device. This spreads the heat over a larger area of the circuit board and increases the surface area from which air circulating over the circuit board may absorb the heat. Thus, the efficiency of the thermal spreading within the circuit board is an important factor in how well heat can be transferred from an electronic device to the ambient air.

As mentioned above, circuit boards are typically very poor conductors of heat. This is mainly due to the fact that they consist of interspersed metal and non-metal layers. The non-metal layers are usually poor thermal conductors. The metal layers do not significantly improve the thermal conductivity of the circuit board because they tend to be thin and discontinuous.

Prior art attempts at reducing the thermal resistance of a circuit board include the use of thick metal layers which have no electrical purposes (except when such layers are used as a ground plane). The thick metal layers are made continuous, and therefore provide significantly improved thermal spreading. This, in turn, helps to limit the temperature rise of the electronic devices. Typically, the circuit board also includes a layer of electrically insulative material between the metal layer and the electronic device to provide the necessary electrical isolation.

One problem with the use of thick metal layers in circuit boards is that the metal layer, the insulator layer, and the electronic device itself all have different thermal expansion properties. That is, as the temperature of the circuit board increases, the device, the insulator and the metal all expand by different amounts. This results in thermally-induced stresses which can cause the electrical connections to the electronic devices to fatigue and fail.

SUMMARY OF THE INVENTION

The present invention provides a circuit board which is optimized for two thermal factors: the ultimate electronic device operating temperature; and the level of thermal stress induced by the heating. High levels of stress are developed when there is a mismatch in the degree of thermal expansion of materials which are bonded together. Therefore, to minimize the thermal expansion stress among the layers of the circuit board and the ICs mounted to the circuit board, it is desirable for the materials involved to have identical or closely-matched thermal expansion coefficients. However, in order to minimize the operating temperature of the IC, it is also desirable to use materials with high thermal conductivity. Generally, materials that are good thermal conductors, have high thermal expansion coefficients, whereas materials with low thermal conduction tend to have low thermal expansion coefficients.

The present invention comprises a multi-layered circuit board with a relatively thick base layer of material having relatively high thermal conductivity and a thermal expansion coefficient close to that of the IC material (typically silicon). In the preferred embodiment, this material is aluminum silicon carbide. The high thermal conductivity provides good thermal spreading within the board, while the matched coefficients of thermal expansion minimize thermal stress between the circuit board and the IC.

In the present invention, the thermal conductivity of the electrically-insulating layer between the base and the electrical circuit paths of the circuit board is maximized. This is accomplished by combining a relatively thin layer of anodized metal with an insulating sealant. The anodized metal may different than the base material, or may be an anodized portion of the base material itself. In the preferred embodiment, a layer of aluminum is formed on the surface of the base layer. The aluminum is then anodized by exposure to sulfuric acid and electric current to create an aluminum oxide layer on the outer surface. This aluminum oxide layer is typically 0.002-in-thick and consumes a 0.001-in-thick portion of the original aluminum coating.

The anodized metal, whether part of the base or a separate material, has a porous structure. An electrically insulative sealant material is then applied to the anodized metal. In the preferred embodiment, the sealant is Teflon FEP. Both aluminum oxide and Teflon FEP are relatively good electrical insulators, and provide the necessary isolation of the base layer from the printed circuit paths of the circuit board. The Teflon also acts as an adhesive to which an upper layer may be attached. In the present invention, a conductive foil (preferably copper) is laminated to the top of the sealant-filled aluminum oxide while the sealant is still in its liquid state. When the sealant hardens, the foil is firmly attached to it and, consequently, to the base. The foil is then post-processed in a conventional manner (such as photoetching) to form electrical traces that are used to provide electrical connection to electronic devices on the circuit board.

While the sealant material has a thermal conductivity which is low compared to the copper and the aluminum silicon carbide, the thermal effect of the sealant is minimized by its integration with the aluminum oxide. Aluminum oxide has relatively good thermal conductivity, and its porous structure allows it to serve as a matrix to the sealant material which flows into its pores. While the microscopic cavities of the anodized metal allow anchoring of the sealant material, the portions surrounding the cavities (which are closer to the metal foil) provide natural thermal vias between the copper foil and the base layer. Thus, the thermal conductivity of the anodized metal/sealant is better than other composite layers, and significantly better than that of a sealant alone. Furthermore, the added bonding strength provided by the anchoring action of the aluminum oxide pores allows the overall thickness of this layer to be kept to a minimum, thus further minimizing the thermal resistance between the board surface and the base layer.

Single or double-layer tapes, such as those made of Kapton® (a registered trademark of E.I. du Pont de Nemours & Co., Inc.), can also be used with present invention to provide multi-layered circuit boards. This structure is commonly referred to as a flexible ("flex") circuit. Flex circuits can have very fine electrical traces with pitches on the order of 0.004 inch. This allows components to be densely located on the circuit board as compared to conventional circuit board layouts. Electronic devices are typically mounted directly to the Kapton tape but, alternatively, holes can be etched into the Kapton to allow the electronic devices to be directly mounted to the Teflon for better thermal conduction.

DETAILED DESCRIPTION OF THE PREFERRED EMBODIMENTS

Figure 1:
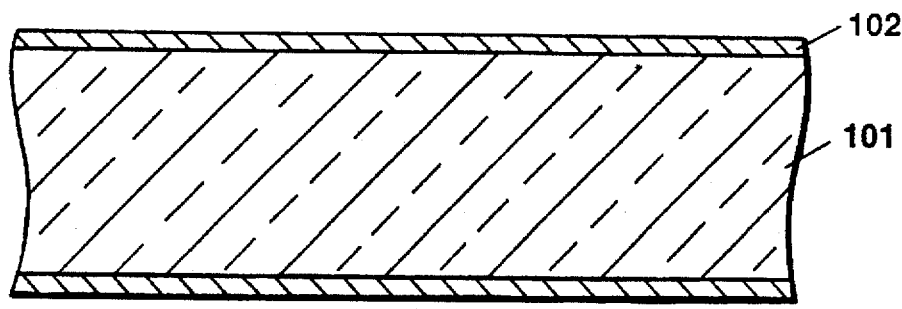
FIG. 1 is a cross-sectional side view of a first stage of circuit board fabrication according to the present invention.
Figure 2:
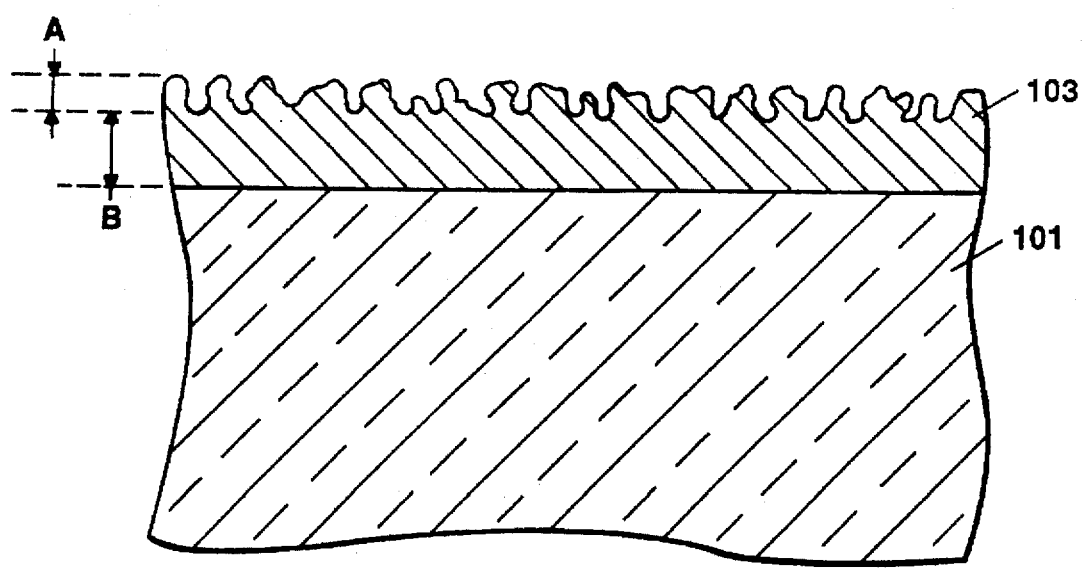
FIG. 2 is a cross-sectional side view of a second stage of circuit board fabrication according to the present invention.
Figure 3:
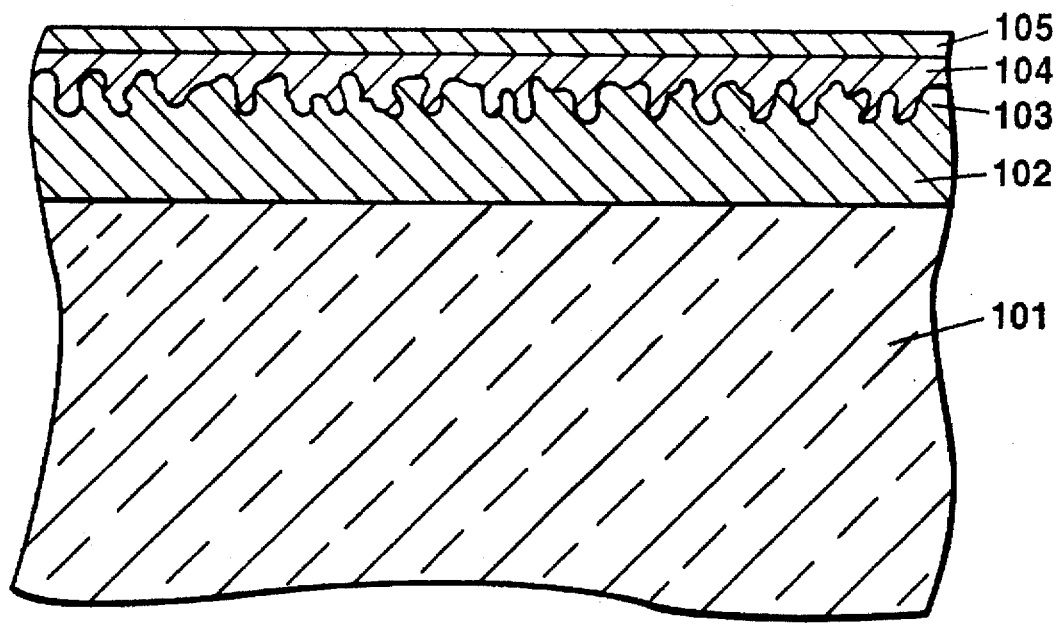
FIG. 3 is a cross-sectional side view of a third stage of circuit board fabrication according to the present invention.

The fabrication steps for the circuit board of the present invention are described herein with reference to FIGS. 1–3.

Shown in FIG. 1 is a base layer 101 formed from a material having good thermal conductivity, and a thermal expansion coefficient close to that of silicon (i.e. is relatively low). The thermal expansion coefficient is matched to silicon since most ICs tend to be silicon-based and, thus, thermal stress due to mismatched thermal expansion coefficients is minimized.

The thermal conductivity of the base layer 101 provides good lateral heat spreading within the circuit board. In the preferred embodiment, the base material is aluminum silicon carbide. However, those skilled in the art will recognize that other materials having similar properties may also be used. The base 101 is significantly thicker than other layers of the circuit board. However, the base thickness may be customized to a particular board design, recognizing that the thermal spreading is better with a thicker base layer.

Formed on the surface of the base 101 in a conventional manner is an anodizeable metal, which in the preferred embodiment is aluminum layer 102. The layer 102 may be unnecessary if the base material is an anodizeable metal, such as aluminum. That is, it is possible to simply anodize the surface of the base material, rather than adding layer 102. However, in the preferred embodiment, the base material is aluminum silicon carbide, and layer 102 is therefore added to provide the anodizeable layer. Thus, the following description will refer to layer 102 as being a different material, although those skilled in the art will understand that layer 102 may simply be a region of base material 101 which is anodized.

Aluminum layer 102 may be formed onto the surface of base 102 as part of the fabrication process, or layers 101 and 102 may be purchased together, as aluminum silicon carbide is commercially available in sheet form with aluminum metal skins. In the preferred embodiment, the aluminum layer 102 is approximately 0.005 inch thick. It is noted that other anodizeable metals may be substituted for aluminum. These include niobium, molybdenum, tantalum, titanium and vanadium.

After its formation, the aluminum layer 102 is anodized using sulfuric acid and an appropriate electric current. This anodizing causes the formation of a layer 103 of aluminum oxide on the surface of the aluminum, and a resulting porous surface structure, as shown in FIG. 2. Dimensions "A" and "B" are used in FIG. 2 to depict, respectively, the porous aluminum oxide portion 103 and the non-porous aluminum portion 102 below. In the preferred embodiment, the aluminum is anodized to provide a porous aluminum oxide region 103 which is approximately 0.002 inch thick, while the non-porous aluminum region 102 is approximately 0.004 inch. Aluminum oxide has the benefits of being a good electrical insulator while having a relatively high thermal conductivity. It is noted that the pores shown in the drawing are not to scale and that, actually, the pore size is microscopic.

After anodizing, a sealant material 104 is applied to the aluminum oxide layer 103, as shown in FIG. 3. In the preferred embodiment, the sealant is fluorinated ethylene propylene (FEP), commonly referred to as Teflon® FEP ("Teflon" is a registered trademark of E.I. du Pont de Nemours & Co., Inc.). The Teflon FEP is heated to its melting temperature of approximately 300° C. It is then forced at a pressure of 275 P.S.I. into the porous surface of the aluminum oxide 103. The natural capillary action of the porous surface may assist in drawing the sealant 104 into the pores of the anodized aluminum layer. In one embodiment, a vacuum is maintained in the vicinity of the porous layer before and during the application of the sealant. The vacuum is later removed after the sealant 104 is applied, but while it is still in a liquid form. This enhances the drawing of the sealant into the pores of the aluminum oxide.

Teflon FEP is a good electrical insulator. The Teflon-filled aluminum oxide has a dielectric strength on the order of 2000 V/mil thickness. A 0.002 inch thick layer of this material thus has a total dielectric strength on the order of 4000 volts, which is more than sufficient for most electronics applications. The thermal conductivity of this layer is approximately one-third of pure aluminum oxide. Due to its thinness, it provides a minimal thermal resistance to the heat flowing through it.

Figure 4:
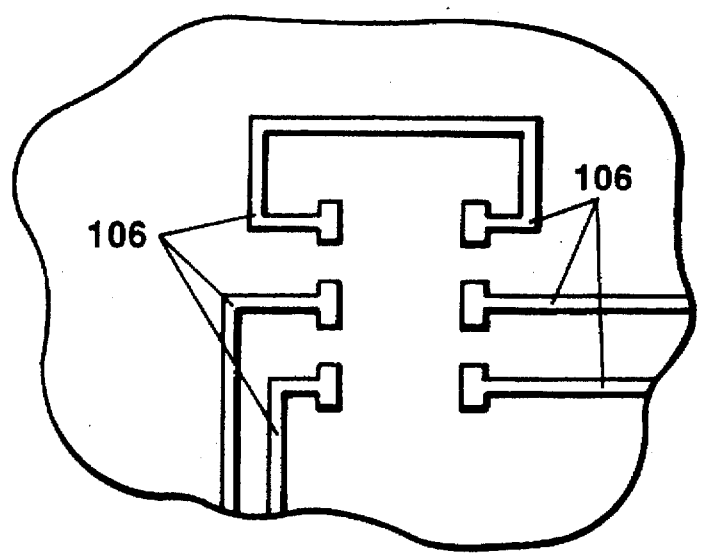
FIG. 4 is a top view of a circuit board according to the present invention.

Referring again to FIG. 3, a layer 105 of metal foil is laminated to the sealant layer 104 after its application. The sealant 104 may be used as an adhesive to secure the foil layer in place. In the preferred embodiment, the foil layer 105 is copper, but other types of electrically conductive material may also be used. A typical copper foil used herein would be a 0.5 ounce to 3 ounce copper. Once the foil 105 is firmly adhered to the sealant 104, electrical traces may be formed from the foil material. This is demonstrated by FIG. 4, which depicts a top view of a portion of the fabricated circuit board according to the present invention. As shown, electrical traces 106 are formed from the foil 105 to provide the desired circuit pathways. In the present embodiment, the foil 105 is photolithographically imaged and etched to expose the adhesive sealant 104, thus electrically isolating the traces 106.

As demonstrated by FIG. 3, the sealant material 104 flows into the pores of the anodized metal 103. In essence, the anodized metal 103 functions as a matrix for the sealant 104, resulting in an anchoring of the sealant to the anodized metal, and correspondingly good bond strength between the two materials. This matrix structure also provides an array of natural thermal vias. The aluminum oxide 103 has much better thermal conductivity than the sealant. The portions of the aluminum oxide 103 which surround the cavities in its porous structure are particularly close to the foil 105, and provide heat conducting channels between the foil and the base material 101, with only a small amount of lower-thermal conductivity sealant material 104 to cross. Thus, good overall thermal conduction is achieved between the foil 105 and the base 101, while maintaining a constant adhesive surface between the sealant 104 and the foil.

Figure 5:
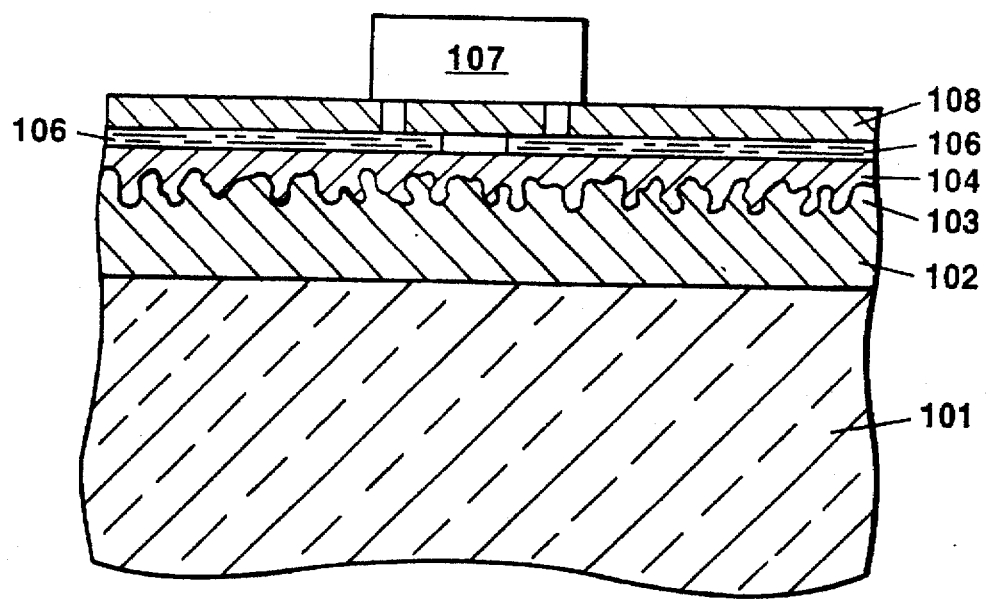
FIG. 5 is a cross-sectional side view of a circuit board according to the present invention upon which a pin-mounted component resides.

FIG. 5 depicts a typical application of the present invention in which an electrical component 107 is soldered or epoxied to the electrical traces 106. Given the finite thickness of the electrical traces 106 and the relative length of the leads of component 107, a thermally-conductive filler 108 is used between the component 107 and the adhesive sealant 104. This allows a high thermal conductivity path between the component 107 and the sealant 104 to be maintained.

Figure 6:
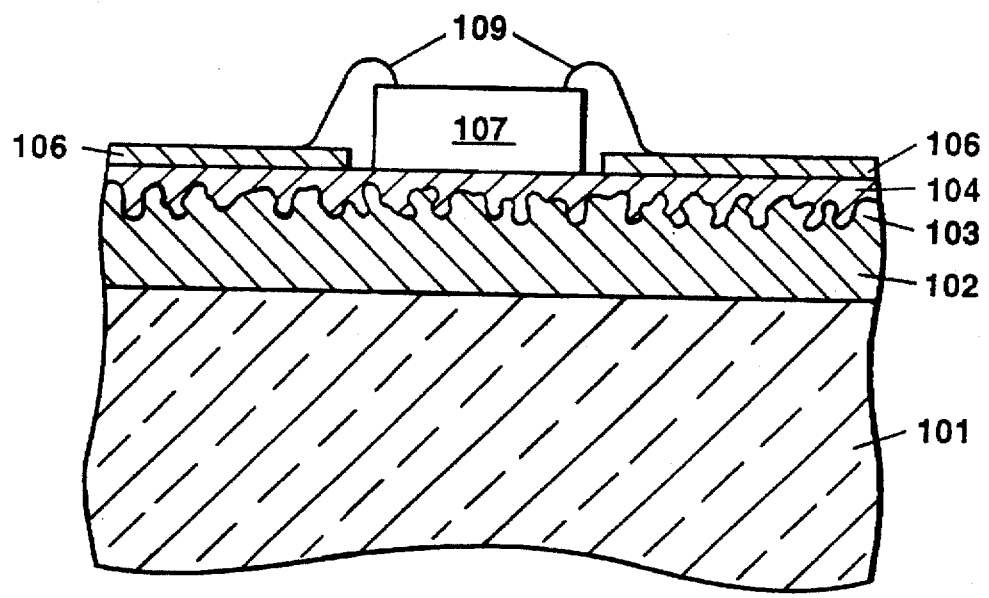
FIG. 6 is a cross-sectional side view of a circuit board according to the present invention upon which a component with conductors on its upper side is mounted.

FIG. 6 shows another application of the present invention in which the electrical component 107 is directly bonded to the adhesive sealant 104. Electrical wires 109 are connected between the electrical traces 106 and the electrical contacts of component 107, which are located on the component's top surface. In this configuration, the component itself is in physical contact with the sealant 104, and the need for a conductive filler material 108 (as shown in FIG. 5) is eliminated.

Figure 7:
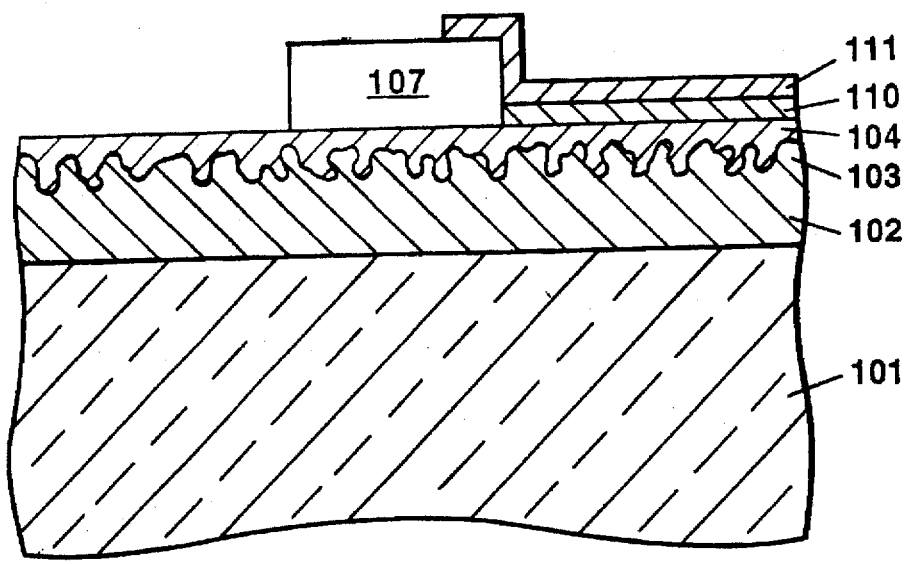
FIG. 7 is a cross-sectional side view of a circuit board according to the present invention upon which a component and a Kapton tape with electrical traces is mounted.

FIG. 7 shows still another application of the present invention in which a Kapton tape 110 is used which has integral electrical traces 111. The use of this type of Kapton tape is common in the flexible circuit industry. In this embodiment, the layer of metal foil (FIG. 3) is eliminated, as the Kapton tape 110 is bonded directly to adhesive sealant 104. The electrical traces 111 are connected to the electrical device 107 by solder or epoxy to provide the desired electrical path.

Figure 8:
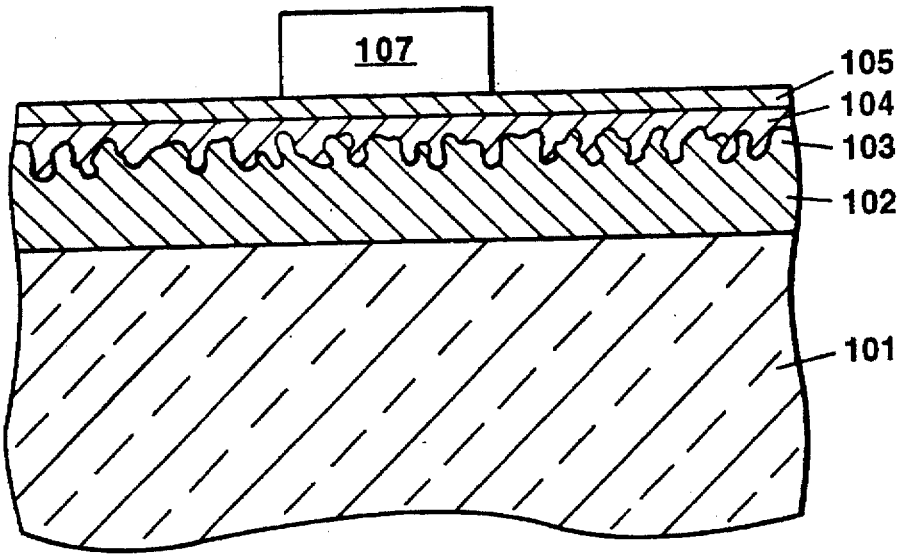
FIG. 8 is a cross-sectional side view of a circuit board according to the present invention upon which a surface-mounted component resides.

The embodiment of FIG. 8 is similar to the surface-mounted embodiment of FIG. 6, but has the component mounted on foil 105, rather than directly on sealant 105. This allows a lateral spreading of heat from the component not only through the base layer 101, but also through the foil layer 105. The contacts for component 107 may extend outward from the component to patterned conductors (not shown) which surround it. This embodiment may also be combined with the embodiment of FIG. 7, such that conductors of the Kapton tape (which may be two-sided or multi-layered) connect to both the top side and the bottom side of component 107.

In certain situations, the underside of the component 107 may also have electrical contacts which are connected directly to patterned conductors beneath the component. In such a case, thermally conductive material could optionally be applied to the recesses surrounding the patterned conductors beneath the component 107 so as to ensure optimum thermal conduction from the component to the sealant layer 104. The arrangement of FIG. 8 is particularly well-suited for applications in which thermal contact points, or exposed bare die, exist on the underside of the component 107 to provide direct thermal contact between the foil and the heat-dissipating material within the component package.

While the invention has been shown and described with reference to a preferred embodiment thereof, it will be understood by those skilled in the art that various changes in form and detail may be made herein without departing from the spirit and scope of the invention as defined by the appended claims.

What is claimed is:

1. A circuit board comprising:

a base layer having first and second opposing surfaces, said base layer provided from a first material having a relatively high thermal conductivity and a coefficient of thermal expansion relatively close to the thermal coefficient of expansion of silicon;

a metal skin layer disposed over each of the first and second opposing surfaces of said base layer, said metal skin layer provided from a second different material which is anodizeable;

an oxide layer having a first surface in contact with said metal skin layer and a having a second surface, the second surface having a plurality of pores formed therein;

a sealant layer having a first surface disposed over the second surface of said oxide layer and a second surface, said sealant layer provided from a thermoplastic resin having an electrically insulative characteristic and having a heat conduction characteristic, and wherein the thermoplastic resin of said sealant layer is disposed to fill the plurality of pores in the oxide layer; and a metal foil having a first surface disposed over and in contact with the second surface of said sealant layer and having a second opposing surface.

2. A circuit board according to claim 1 wherein:

said base layer is provided from aluminum silicon carbide;

said metal skin layer is provided from aluminum;

said oxide layer is provided as aluminum oxide; and said metal foil is provided from electro-deposited copper.

3. A circuit board according to claim 2 further comprising: a semiconductor circuit disposed on and electrically coupled to the second surface of said copper foil.

4. A circuit board according to claim 3 wherein:
a portion of said semiconductor circuit directly contacts the second surface of said copper foil; and
the thermoplastic resin is embedded in substantially all of the pores of said oxide layer.

5. A circuit board according to claim 2 wherein:
said oxide layer is provided having a thickness typically of about 0.002 inch;
said metal skin layer is provided having a thickness typically of about 0.005 inch;
said thermoplastic resin is provided a sheet of thermoplastic resin having a thickness of about 0.002 inch.

6. A circuit board according to claim 5 wherein said thermoplastic resin is provided from fluorinated ethylene propylene.

7. A circuit board according to claim 6 further comprising a layer of Kapton tape to which said semiconductor circuit is mounted, the Kapton tape being in thermal communication with said thermoplastic resin.

8. A circuit board according to claim 7 wherein the heat-dissipating component is a pin-mounted IC package.

9. A circuit board according to claim 6 wherein said semiconductor circuit is a bare die.

10. A circuit board according to claim 9 wherein a first surface of said bare die is in physical contact with said sealant layer.

11. A circuit board comprising:
a base layer of aluminum silicon carbide having first and second opposing surfaces;
a layer of anodized aluminum having a first surface disposed against the first surface of said base layer and having a second porous surface;
a thermoplastic resin embedded in substantially all of the interstitial regions of the porous surface of said anodized aluminum; and
a layer of electrically conductive material in contact with said thermoplastic resin.

12. A method of fabricating a circuit board comprising:
(a) providing a base layer of material having relatively high thermal conductivity;
(b) anodizing the first surface of said base layer to provide a layer of oxide having a porous surface and having a thickness typically of about 0.002 inch;
(c) disposing a thermoplastic resin over the porous surface of the oxide layer;
(d) heating the thermoplastic resin to a temperature corresponding to a melting temperature of the thermoplastic resin such that the thermoplastic resin changes to a liquid state; and
(e) forcing the thermoplastic resin into substantially all of the pores of the oxide layer while the thermoplastic resin is in a liquid state.

13. A method according to claim 12 wherein the step of providing a base layer of material having relatively high thermal conductivity includes the steps of:
providing a base layer of aluminum silicon carbide; and
forming a layer of aluminum over the aluminum silicon carbide base layer to provide the first surface of said base layer.

14. A method according to claim 13 wherein the step of anodizing the first surface of the base layer includes the step of anodizing the layer of aluminum to form a layer of aluminum oxide.

15. A method according to claim 14 wherein the step of forcing the thermoplastic resin into substantially all of the pores of the oxide layer includes the steps of:
applying pressure to the thermoplastic resin while the thermoplastic resin is in a liquid state;
removing pressure from the thermoplastic resin while the thermoplastic resin is in a liquid state; and
drying the thermoplastic resin such that the thermoplastic resin is embedded within substantially all of the interstitial regions of the porous surface of the aluminum oxide layer.

16. A method according to claim 15 further comprising the steps of:
laminating a layer of electrically conductive material to the aluminum oxide layer; and
forming electrical circuit paths from the electrically conductive material.

17. A method according to claim 16 wherein the step of laminating a layer of electrically conductive material to the aluminum oxide layer comprises the steps of disposing a copper foil over the thermoplastic resin; and
securing the copper foil to the surface of the aluminum oxide layer having the thermoplastic resin embedded in the pores.

18. A method according to claim 17 wherein the step of:
disposing the copper foil over the thermoplastic resin includes the step of disposing the copper foil over the thermoplastic resin while the thermoplastic resin is in a liquid state; and
the step of securing the copper foil to the surface of the aluminum oxide layer includes the step of adhering the copper foil to the oxide layer with the thermoplastic resin.

19. A method according to claim 18 wherein:
the step of heating the thermoplastic resin includes the step of heating the thermoplastic resin to a temperature of about 300° Celsius; and
the step of applying pressure to the thermoplastic resin includes the step of forcing the thermoplastic resin in a liquid state into the porous surface of the oxide layer at a pressure of about 275 P.S.I.

20. A method according to claim 12 wherein the step of forcing the thermoplastic resin into substantially all of the pores of the provides a thermoplastic resin filled oxide layer having a thickness of about 0.002 inch.

21. A method according to claim 12 further comprising the steps of:
forming a vacuum around the base layer;
removing said vacuum while the thermoplastic resin is in a liquid state.

22. A method according to claim 21 wherein the base material is provided from aluminum silicon carbide having an aluminum skin disposed thereover.

* * * * *